United States Patent
Pittorino

(10) Patent No.: US 7,372,343 B2
(45) Date of Patent: May 13, 2008

(54) OSCILLATOR CIRCUIT

(75) Inventor: Tindaro Pittorino, Linz (AT)

(73) Assignee: Infineon Technologies AG, Munich (DE)

( * ) Notice: Subject to any disclaimer, the term of this patent is extended or adjusted under 35 U.S.C. 154(b) by 62 days.

(21) Appl. No.: 11/336,505

(22) Filed: Jan. 20, 2006

(65) Prior Publication Data

US 2006/0220756 A1 Oct. 5, 2006

(30) Foreign Application Priority Data

Jan. 27, 2005 (DE) ............ 10 2005 003 904

(51) Int. Cl.
  *H03B 5/12* (2006.01)
(52) U.S. Cl. ............ 331/117 FE; 331/167; 331/177 V; 331/36 C
(58) Field of Classification Search ........ 331/36 C, 331/117 R, 117 FE, 167, 177 R, 177 V
See application file for complete search history.

(56) References Cited

U.S. PATENT DOCUMENTS

| | | | |
|---|---|---|---|
| 5,247,265 A * | 9/1993 | Norimatsu | 331/16 |
| 5,739,730 A * | 4/1998 | Rotzoll | 331/177 V |
| 6,621,364 B2 * | 9/2003 | Grewing et al. | 331/177 V |
| 6,917,248 B2 * | 7/2005 | Nguyen | 331/117 R |
| 7,183,870 B2 * | 2/2007 | Takagi | 331/177 V |
| 2002/0014925 A1 * | 2/2002 | Ochiai | 331/117 FE |

FOREIGN PATENT DOCUMENTS

DE    102 09 517 A1    6/2003
DE    103 12 436 A1    10/2004

* cited by examiner

*Primary Examiner*—Benny Lee
*Assistant Examiner*—Ryan J Johnson
(74) *Attorney, Agent, or Firm*—Eschweiler & Associates, LLC

(57) ABSTRACT

The invention is directed to an oscillator circuit in which a frequency-determining resonant circuit includes an inductive element, a first capacitive element and at least one second capacitive element which is connected in series with the first capacitive element. A node is provided between the first capacitive element and at least one second capacitive element. The oscillator circuit contains a damping reduction amplifier which is arranged in parallel with the frequency-determining resonant circuit. In addition, the oscillator circuit has a first tuneable capacitive element, which is connected in parallel with the first capacitive element of the resonant circuit and has a connection connected to the node.

15 Claims, 3 Drawing Sheets

US 7,372,343 B2

OSCILLATOR CIRCUIT

REFERENCE TO RELATED APPLICATIONS

This application claims the benefit of the priority date of German application DE 10 2005 003 904.9, filed on Jan. 27, 2005, the contents of which are herein incorporated by reference in their entirety.

FIELD OF THE INVENTION

The invention relates to an oscillator circuit.

BACKGROUND OF THE INVENTION

Oscillator circuits are generally used for providing a stable-frequency signal and are used, inter alia, in controlled oscillators which are part of a phase locked loop for mobile communication appliances.

FIG. 5 shows a block diagram of such a phase locked loop which is used to generate signals at output frequencies of up to several gigahertz. The phase locked loop shown comprises a voltage controlled oscillator 7 having an actuating input 71 and a signal output 72, at which the output signal at the frequency $f_{VCO}$ can be tapped off. The signal which is output by the voltage controlled oscillator 7 is supplied to a feedback path which contains a frequency divider having an adjustable frequency divider ratio. The frequency of the feedback signal is divided in the frequency divider 8 by the set factor. The frequency-divided signal is then applied to a feedback input 52 of a phase detector 5.

The phase detector 5 contains a reference input 51 which is connected to a reference oscillator 4. It compares the phases of the signals applied to the reference input 51 and to the feedback input 52 and generates an actuating signal therefrom which is supplied to the actuating input of the voltage controlled oscillator 7 via a loop filter 6. The actuating signal is preferably proportional to the difference between the two phases at the inputs 51 and 52 of the phase detector. The actuating signal causes the oscillator to change its output frequency, until the phase difference between the signals applied to the inputs 51 and 52 of the phase detector disappears.

The demands on power consumption and production costs have necessitated new production technologies and the implementation of such phase locked loops as integrated circuits in semiconductor bodies.

Modern phase locked loops are implemented in CMOS technology, for example, with physical dimensions in the submicron range. The intense nonlinear response of the frequency-voltage characteristics of CMOS components and particularly of CMOS varactor diodes means that particular challenges are placed on the implementation of frequency adjustment for voltage controlled oscillators in CMOS technology.

One way of solving the aforementioned problem is to implement a "digitally controllable oscillator" whose output frequency is adjusted not continuously but rather in small discrete-value steps. This also has the additional advantage that it is possible to use smaller digital loop filters within the phase locked loops instead of the large-area analogue loop filters.

For mobile communication systems, the minimum difference between two frequencies is dependent on the communication standard chosen. By way of example, it may be between 100 kHz and 200 kHz. However, it is expedient on account of process variations in production and temperature fluctuations to implement smaller frequency steps so as to compensate for fluctuations in manufacture and external influences. In this case, the smallest frequency step is produced by a switching operation between a maximum and a minimum value for the smallest capacitance value that is to be implemented for the given semiconductor technology.

On account of the small dimensions, small process variations during production have a drastic influence on this capacitance value. In addition, the phase noise increases as the fundamental frequency of an output signal from a voltage controlled oscillator implemented in this manner rises.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention is directed to an oscillator circuit whose frequency settings are as independent as possible of component variations during production.

In accordance with the invention, an oscillator circuit comprises a frequency-determining resonant circuit which contains an inductive element, a first capacitive element and at least one second capacitive element which is connected in series with the first capacitive element. A node is provided between the first capacitive element and the at least one second capacitive element connected in series. The oscillator circuit contains a damping reduction amplifier which is connected in parallel with the frequency-determining resonant circuit. In addition, the oscillator circuit comprises a first tuneable capacitive element, which is connected in parallel with the second capacitive element and has a connection connected to the node.

In accordance with the invention, a first tuneable capacitive element is thus connected in parallel with a capacitive element of the frequency-determining resonant circuit in order to tune the output frequency of the resonant circuit. The parallel circuit reduces the influence of the first tuneable capacitive element. In particular, the effective capacitance of the first tuneable capacitive element, which capacitance is required for the frequency determination in the oscillator circuit, is reduced by a factor which is obtained from the capacitance values of the first and second capacitive elements.

The capacitive elements can thus be increased in size, which means that process fluctuations have no significant effect, and at the same time a smaller capacitance change and hence accurate adjustment of the output frequency continues to be possible. The phase noise is reduced at the same time. In addition, it becomes possible to increase the size of the inductive element, which further reduces the phase noise in the entire oscillator circuit.

In addition, a second tuneable capacitive element is connected in parallel with the inductive element of the resonant circuit. The second tuneable capacitive element is used to set the frequency of an output signal from the inventive oscillator circuit. The parallel circuit comprising the second tuneable capacitive element and the inductive element thus allows a frequency change in large frequency steps. By contrast, the first tuneable capacitive element with its small frequency steps is used for fine tuning an output frequency from the oscillator circuit.

In one embodiment, the first tuneable capacitive element is in the form of a capacitive element which can be tuned using discrete values. In one example, the sum of the capacitance values of the first and the at least one second capacitive element is greater than a capacitance value of the first tuneable capacitive element. Preferably, the influence of the first tuneable capacitive element is thus reduced by an appropriate factor which is obtained from the capacitance values of the first and at least one second capacitive element.

In another embodiment of the invention, the second tuneable capacitive element comprises a large number of varactors which are connected in parallel. In one development of the invention, the first tuneable capacitive element also contains a large number of tuneable capacitive elements. In one embodiment, the tuneable elements contain tuneable capacitors or a large number of switchable capacitors. In one example, the capacitive elements can be switched using discrete values, that is to say that they are added to the first tuneable capacitive element in order to increase its capacitance value, or are removed in order to reduce it. This means that the total capacitance can be set by connecting the switching varactors in parallel.

In one embodiment of the invention, the capacitance values of the varactors in the first tuneable capacitive element and in the second tuneable capacitive element are of equal magnitude. This has the advantage that they can easily be generated using the same process technology with small process variations. This allows errors to be reduced in simple fashion. In another embodiment of the invention, a first varactor from the large number of varactors in the first and/or second tuneable capacitive element differs from a second varactor from the large number of varactors in the first and/or second tuneable capacitive element by the factor 2. This allows binary weighting in the frequency setting of the inventive oscillator circuit. In another embodiment, the first tuneable capacitive element comprises a tuneable capacitor.

In another alternative embodiment, the first tuneable capacitive element is in the form of a varactor. In one embodiment, it comprises at least one field effect transistor pair. In this pair, a control connection of one of the transistors in the field effect transistor pair is coupled to the node and a control connection of the other transistor in the field effect transistor pair is coupled to the first capacitive element of the frequency-determining resonant circuit. In one development of this embodiment, sink connections of the transistors in the field effect transistor pair are connected to one another and to the respective source connections of the transistors in the field effect transistor pair.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The text below explains the invention in detail using exemplary embodiments with reference to the drawings, in which.

DETAILED DESCRIPTION OF THE INVENTION

Generally, the following applies for the resonant frequency of a resonant circuit:

$$f = \frac{1}{2\pi\sqrt{LC}}$$

The resonant frequency f for a resonant circuit is proportional to the reciprocal of the square root of the product of the inductive element L and of the capacitive element C.

To set the resonant frequency of a resonant circuit as appropriate, a further capacitive element is expediently introduced, whose capacitance value is adjustable. This allows the resonant frequency of the resonant circuit to be changed.

Figure 4:
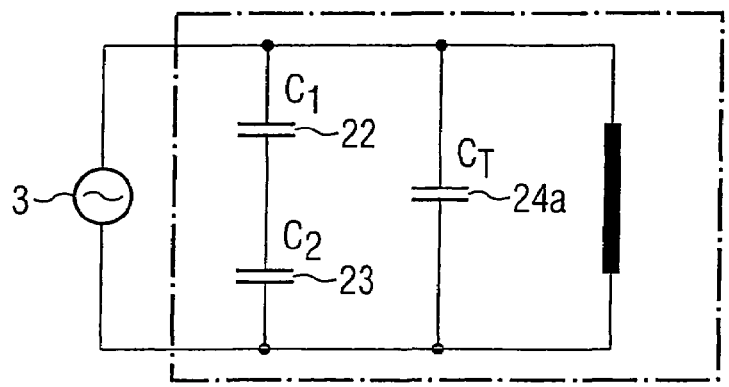
FIG. 4 is a schematic diagram illustrating a prior art oscillator circuit.
Figure 5:
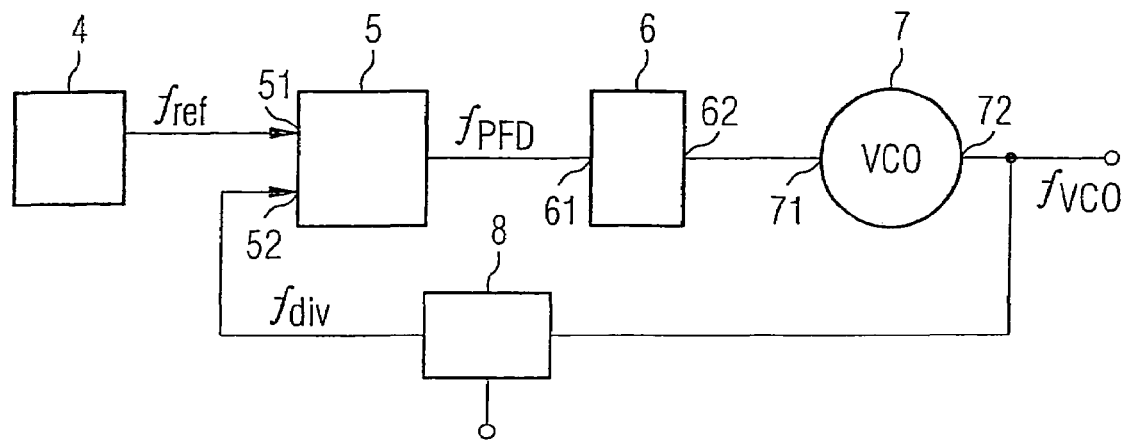
FIG. 5 is a block diagram illustrating a prior art phase locked loop with a voltage controlled oscillator.

FIG. 4 shows a block diagram of a prior art oscillator containing such a resonant circuit. In this context, the term "oscillator" is intended to be understood to mean circuits which generate undamped electrical oscillations of particular curve shape and frequency at substantially constant amplitude. In this case, the frequency is determined by the resonant frequency f of the resonant circuit. Since resonant circuits have damping, it is necessary to provide an appropriate source of energy or a damping reduction amplifier which compensate for the damping in the form of a positive impedance. In the known oscillator circuit shown in FIG. 4, the negative impedance is indicated by the current source 3.

The total capacitance of the resonant circuit shown in prior art FIG. 4 is obtained from the individual capacitance values $C_1$ and $C_2$ of the capacitive elements 22 and 23 and from the capacitance value $C_T$ of the tuneable capacitive element 24a. The total capacitance $C_{tot}$ is accordingly $$C_{tot} = \frac{C_1 * C_2}{C_1 + C_2} + C_T$$

It is dependent on the variable capacitance $C_T$. A total change in the capacitance $\Delta C_{tot}$ is thus obtained in direct proportion from a change in the value $\Delta C_T$ of the setting capacitance 24a. It follows that: $\Delta C_{tot} = \Delta C_T$. Since, particularly in digitally controlled oscillators (DCO), the capacitance values of the adjustable or tuneable capacitive elements need to be very small in order to allow small changes in frequency, just small fluctuations during process production or during later operation influence the value $C_T$ of the tuneable capacitive element 24*a* and hence also the output frequency of the oscillator circuit.

Figure 1:
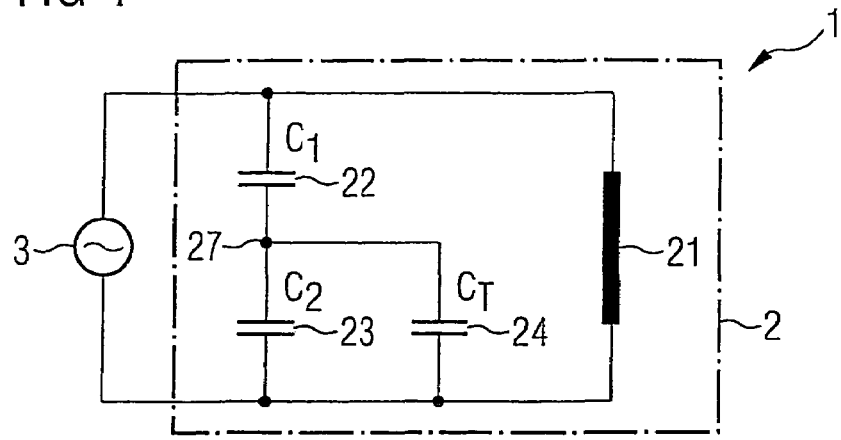
FIG. 1 is a schematic diagram illustrating a principle of the present invention.

By contrast, FIG. 1 shows a block diagram containing the inventive oscillator circuit, in which the influence of process fluctuations or later changing operating parameters on the output frequency of the oscillator circuit is reduced. In this embodiment, the tuneable capacitance for changing the output frequency of the oscillator circuit is connected in parallel with one of the two capacitive elements 22 and 23. In the present case, the tuneable capacitive element 24 is connected in parallel with the capacitive element 23.

One connection is connected to a node 27 between the first and second elements 22 and 23. For the total capacitance of the resonant circuit in the inventive oscillator circuit, the following applies:

$$C_{tot} = \frac{C_1(C_2 + C_T)}{(C_1 + C_2 + C_T)}$$

A change in the total capacitance $\Delta C_{tot}$ when there is a change in the tuneable capacitance $C_T$ results in the illustration:

$$\Delta C_{tot} = \frac{C_1^2}{(C_1 + C_2) * (C_1 + C_2 + \Delta C_T)} * \Delta C_T$$

In contrast to the topology shown in FIG. 4, the result is a proportional dependency, altered by a factor, of the total capacitance $C_{tot}$ on a change in the value $C_T$ of the tuneable capacitance C24.

If the sum of the capacitance values $C_1$ and $C_2$ of the two capacitive elements 22 and 23 is much greater than the capacitance value $C_T$ of the tuneable capacitive element 24, then the following applies:

$$\Delta C_{tot} = \left(\frac{C_1}{C_1 + C_2}\right)^2 * \Delta C_T = n^2 * \Delta C_T \text{ where } n < 1$$

From the above expression it can be seen that the influence on the resonant circuit for the tuneable capacitive element 24 connected up as shown in FIG. 1 is reduced by the factor $n^2$ over the resonant circuit in the oscillator circuit shown in prior art FIG. 4. The term $n^2 * \Delta C_T$ therefore forms an effective capacitance. The effect of a change in the capacitance of the tuneable capacitive element 24 is therefore reduced just by the factor $n^2$. Consequently, the components may be of larger design, with the total capacitance and hence the resonant frequency changing with a reduction just by the appropriate factor. The use of larger components reduces the influence on component variations during implementation. In addition, the smallest capacitance which can be produced for a given production technology can be controlled by the sizes of the capacitive elements 22 and 23. This is preferably independent of technology.

Figure 2:
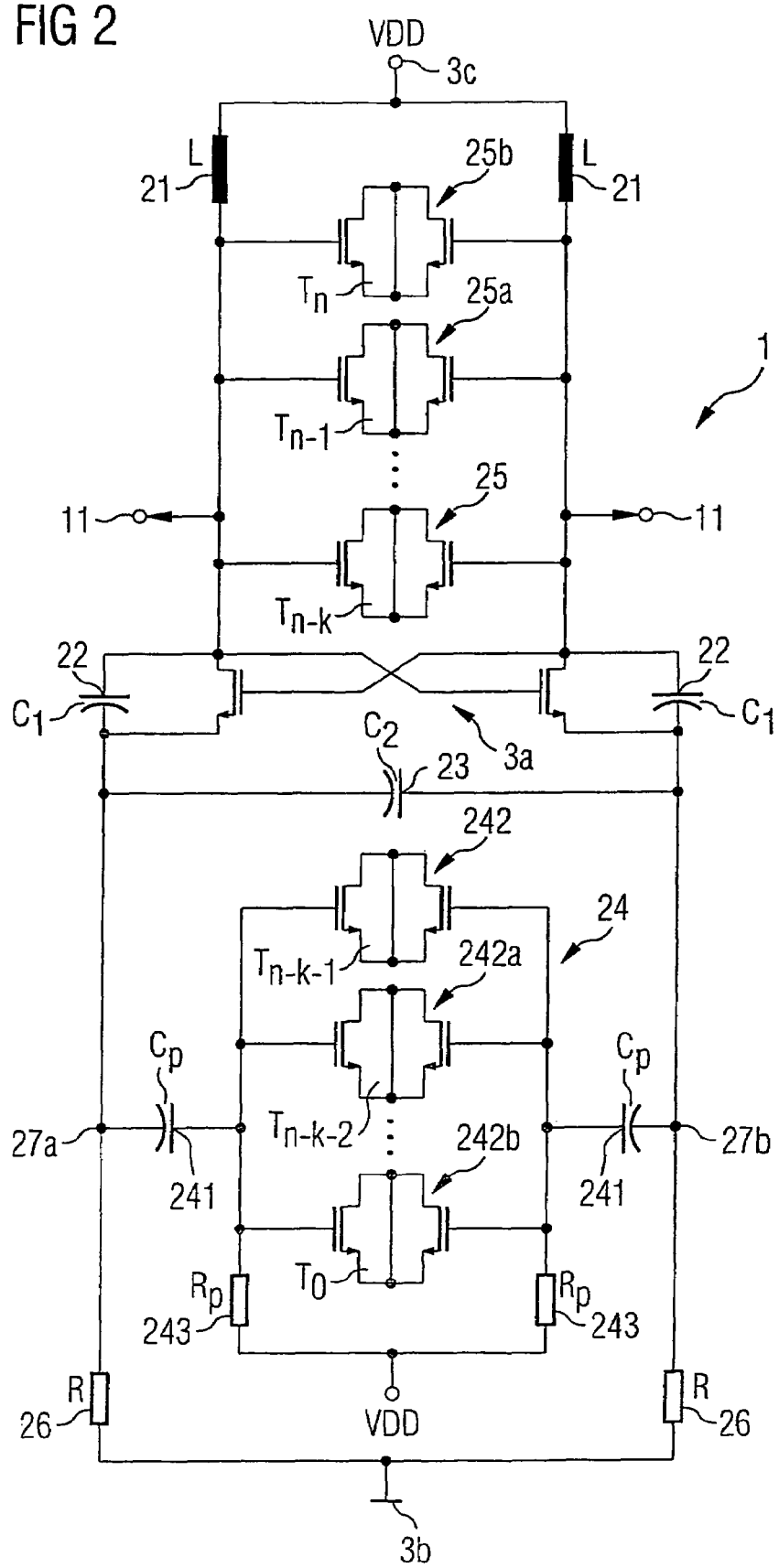
FIG. 2 is a schematic diagram illustrating a first exemplary embodiment of the oscillator circuit according to the invention.

FIG. 2 shows a specific example of the inventive oscillator circuit 1, as can be used in a phase locked loop as an oscillator, for example. The embodiment shown here is implemented in a semiconductor body as an integrated circuit in CMOS technology and represents an oscillator which can be controlled using discrete values (DCO, "digital controlled oscillator"). Instead of capacitances which can be tuned using discrete values, it is also possible to implement capacitances which can be tuned using continuous values or a combination of the two, and such alternatives are contemplated as falling within the scope of the present invention.

Suitable semiconductor materials are silicon, or else compound semiconductors such as gallium arsenide (GaAs) and silicon germanium (SiGe). Fitted on the surface of the semiconductor body (not shown here) are a plurality of connection contacts which are connected to the inventive oscillator circuit integrated within the semiconductor body. The connection contacts are used to supply the necessary supply voltage or supply current. Further connection contacts form the output taps at which it is possible to tap off the local oscillator signal from the inventive oscillator circuit. It is naturally also possible to implement further circuits in the same semiconductor body, for example, the circuits for forming a phase locked loop. The inventive oscillator circuit is thus implemented in the semiconductor body which comprises further elements.

In line with the exemplary embodiment in FIG. 2, these connection contacts are formed by the outputs 11 of the local oscillator circuit.

The oscillator circuit shown here is in the form of a digitally controllable oscillator (DCO) with frequency steps which can be set using discrete values. Equally, continuous adjustment is also possible. The oscillator circuit 1 contains a resonant circuit comprising the coils 21 and the tuneable capacitive elements 22, 23, 24 and 25, 25*a* and 25*b*. These are the frequency-determining elements of the resonant circuit, some being tuneable or switchable, so that the resonant frequency of the resonant circuit can be changed.

The oscillator circuit 1 is designed for processing normal-mode signals. The coil is divided into two coil elements, whose common connecting node is connected to a first connecting node 3*c*. This node can be supplied with the supply potential VDD. Respective second connections of the coil are connected to a drain connection of a transistor which forms a damping reduction amplifier 3*a*. In parallel with this, a plurality of varactor diodes 25, 25*a* and 25*b* are connected into the resonant circuit and between the output taps 11. These are used to produce large frequency changes in the resonant frequency of the oscillator circuit.

The varactors 25, 25*a* and 25*b* respectively comprise in one example a field effect transistor pair comprising two NMOS field-effect transistors. These are connected to one another by their drain and source connections. In addition, the source connection of each transistor is coupled to its corresponding drain connection. The control connections of the two field-effect transistors are connected to one of the two taps.

The damping reduction amplifier 3*a* comprises a pair of cross-coupled field effect transistors whose control connections are respectively coupled to the drain connection of the other transistor. Connected between the source and drain connections of each transistor is a first capacitive element 22 in the form of a capacitor. The damping reduction amplifier 3*a* is used during operation to provide a negative impedance which compensates for the damping and hence the positive impedance of the resonant circuit in the inventive oscillator circuit.

Connected between the two source connections of the transistors in the damping reduction amplifier 3*a* is a second capacitive element 23. In addition, the source connections of the transistors in the damping reduction amplifier 3*a* are connected to a common base point 3*b* via resistors 26 in order to supply a ground potential.

The two capacitors 22 and 23 form the series circuit comprising the two capacitive elements which is shown in FIG. 1. In parallel with the capacitive element 23, a tuneable capacitive element 24 is connected between the nodes 27a and 27b. This capacitive element contains a multiplicity of varactors 242, 242a and 242b which are arranged in parallel. The varactors likewise comprise two field effect transistors whose source and drain connections are connected to one another. The dimensions of these varactors are approximately the same size as the dimensions of the varactors 25, 25a and 25b. They thus have similar capacitance values.

The parallel connection of this element 24 to the capacitive element 23 means that the frequency change when there is a change in the capacitance of the element 24 and hence the influence on the resonant frequency of the resonant circuit during a switching operation by these varactors is significantly smaller than prior art solutions. The control connections of the transistors in the varactors 242, 242a and 242b are connected to the supply potential VDD via coupling resistors 243. The capacitance of each individual varactor element 242, 242a, 242b can be changed through appropriate actuation of the source and drain connections and application of a potential. Alternatively, any switching circuitry operable to selectively couple and decouple the varactors into the circuit and thereby alter the capacitance may be employed and is contemplated by the present invention.

In addition, decoupling capacitors 241 are provided which have a respective first connection connected to the control connections of the transistors in the varactors 242 and which have a second connection connected to the source connections of the transistors in the damping reduction amplifier 3a. The decoupling capacitors 241 decouple the DC components of the tuneable capacitive element 24 from the resonant circuit in the oscillator circuit and, together with the resistors 243, serve to set the operating point of the varactors 242, 242a and 242b.

In addition, the second capacitive element 23 connected between the two source connections of the transistors in the damping reduction amplifier 3a also reduces the effective source negative feedback resistance R for high frequencies. For frequencies above $0.5 * R * C_2$, the source connections of the two transistors in the damping reduction amplifier 3a are shorted to the earth point 3b, which advantageously increases the gain for each transistor in the damping reduction amplifier. This allows the use of transistors with a smaller surface area or the reduction of the phase noise in the oscillator circuit.

The embodiment of the oscillator circuit shown in FIG. 2 contains two tuneable elements. In this case, the change in capacitance in each tuneable element is of equal magnitude in the present embodiment instance, provision naturally also being able to be made for other methods of weighting the capacitances, for example a binary weighting method. On account of the special arrangement of the tuneable capacitive element 24 in the form of a parallel connection to the capacitive element 23, the effect of a capacitance change here is less than in the case of the varactors 25, 25a and 25b, however. This means that the capacitive element 24 can be used particularly for fine adjustment of the output frequency from the resonant circuit in the oscillator circuit.

Figure 3:
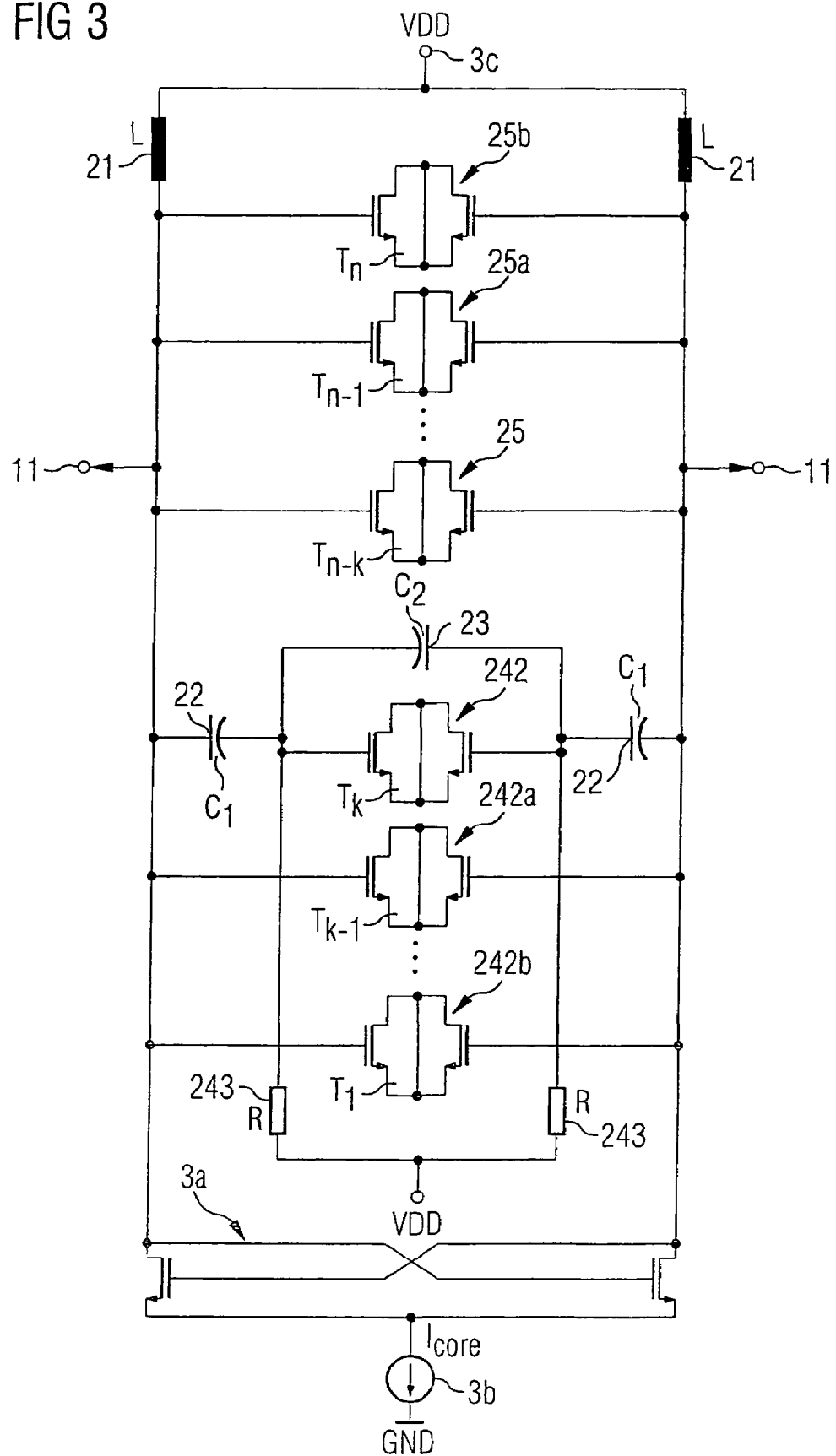
FIG. 3 is a schematic diagram illustrating a second exemplary embodiment of the oscillator circuit according to the invention.

FIG. 3 shows a second exemplary embodiment based on the invention. Components which have the same effect or function bear the same reference symbols. The embodiment shown has different gain properties on account of the separate arrangement of the capacitor 23.

In the present case, the arrangement comprising series and parallel capacitances is formed by two capacitors 22 which have a respective connection connected to the drain connections of the transistors in the damping reduction amplifier 3a. The second capacitive element in the form of the capacitor 23 is connected between the respective second connections. The capacitors 22 and 23 thus form a series circuit. Arranged in parallel with the capacitor 23 are the varactor diodes 242, 242a and 242b as tuneable elements.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising". In addition, the term "exemplary" as utilized herein merely means an example, rather than the best.

The invention claimed is:

1. An oscillator circuit, comprising:
a frequency-determining resonant circuit comprising an inductive element, a first capacitive element, and at least one second capacitive element that is connected in series with the first capacitive element, thereby defining a node therebetween;
a damping reduction amplifier coupled in parallel with the frequency-determining resonant circuit;
a first tuneable capacitive element coupled in parallel with the at least one second capacitive element and coupled to the node;
a second tuneable capacitive element coupled in parallel with the inductive element of the resonant circuit;
wherein the first tunable capacitive element is connected with a first terminal to a first terminal of the at least one second capacitive element and with a second terminal to a second terminal of the at least one second capacitive element, and wherein the first tuneable capacitive element comprises a plurality of varactors selectively coupled together in parallel; and
wherein the second terminal of the first tunable capacitive element is also connected to the node between the first and at least one second capacitive element,
wherein the second tuneable capacitive element comprises a plurality of varactors selectively coupled together in parallel, and wherein a capacitance value of a first varactor of the plurality of varactors in the first or second tuneable capacitive element differs from a capacitance value of a second varactor of the plurality of varactors in the first or second tuneable capacitive element, respectively, by the factor $2^n$, where n is a natural number.

2. The oscillator circuit of claim 1, wherein a sum of capacitance values of the first and the at least one second capacitive element is greater than a capacitance value of the first tuneable capacitive element.

3. The oscillator circuit of claim 1, wherein the first tuneable capacitive element is configured as a variable capacitance having a value that is variable in discrete-value steps.

4. The oscillator circuit of claim 1, wherein the second tuneable capacitive element comprises a plurality of varactors selectively coupled together in parallel.

5. The oscillator circuit of claim 1, wherein the second tuneable capacitive element comprises a plurality of varactors selectively coupled together in parallel, and wherein the capacitance values of the varactors in the first tuneable capacitive element and in the second tuneable capacitive element are the same.

6. The oscillator circuit of claim 1, wherein the first tuneable capacitive element comprises at least one field effect transistor pair, in which a control connection of one of the transistors in the field effect transistor pair is coupled to the node, and a control connection of the other transistor in the field effect transistor pair is coupled to the second capacitive element.

7. The oscillator circuit of claim 6, wherein respective source and drain connections of the transistors in the field effect transistor pair are connected to one another and shorted together.

8. The oscillator circuit of claim 1, wherein the second tuneable capacitive element comprises at least one field effect transistor pair, in which control connections of the transistors in the field effect transistor pair are coupled in parallel with the inductive element.

9. The oscillator circuit of claim 1, further comprising a coupling capacitor provided between the first tuneable capacitive element and the node.

10. An oscillator circuit, comprising:
a frequency determining resonant circuit comprising an inductive element, a first capacitive element, and at least one second capacitive element that is connected in series with the first capacitive element, thereby defining a node therebetween;
a damping reduction amplifier coupled in parallel with the frequency determining resonant circuit;
a first tuneable capacitive element coupled in parallel with the at least one second capacitive element and coupled to the node;
a second tuneable capacitive element coupled in parallel with the inductive element of the resonant circuit,
wherein a variation in a total capacitance of the oscillator circuit is smaller by a factor than a variation in the first tuneable capacitive element, wherein the factor comprises a ratio of the value of the second capacitive element to the sum of the values of the first and second capacitive elements.

11. A phase locked loop circuit, comprising:
a phase detector configured to compare a reference signal and a divided feedback signal, and output a control signal in response thereto;
a frequency divider configured to receive an output signal and generate the divided feedback signal based on the output signal; and
a controlled oscillator configured to generate the output signal as a function of the control signal, wherein the controlled oscillator comprises:
a resonant circuit comprising an inductive element in parallel with first and second series-connected capacitances, and a first tuneable capacitance element coupled in parallel with the second capacitance;
wherein the first tunable capacitive element is connected with a first terminal to a first terminal of the at least one second capacitive element and with a second terminal to a second terminal of the at least one second capacitive element; and
wherein the second terminal of the first tuneable capacitive element is also connected to a node between the first and at least one second capacitive element,
wherein a variation in a total capacitance of the resonant circuit is smaller by a factor than a variation in the first tuneable capacitive element, wherein the factor comprises a ratio of the value of the second capacitance to the sum of the values of the first and second capacitances.

12. The phase locked loop of claim 11, wherein the controlled oscillator further comprises a damping reduction amplifier coupled in parallel with the resonant circuit.

13. The phase locked loop of claim 11, wherein a sum of capacitance values of the first and second series-connected capacitances is greater than a capacitance value of the first tuneable capacitance.

14. The phase locked loop of claim 11, wherein the first tuneable capacitance comprises a plurality of varactors selectively coupled together in parallel, and wherein a number of varactors coupled together in parallel dictates one of a plurality of discrete capacitance values.

15. The phase locked loop of claim 11, further comprising a second tuneable capacitance coupled in parallel with the inductive element.

* * * * *